(12) United States Patent
Chopra et al.

(10) Patent No.: US 7,976,733 B2
(45) Date of Patent: Jul. 12, 2011

(54) AIR STABLE COPPER NANOPARTICLE INK AND APPLICATIONS THEREFOR

(75) Inventors: Naveen Chopra, Oakville (CA); Matthew Worden, Fergus (CA); Peter M. Kazmaier, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 893 days.

(21) Appl. No.: 11/948,098

(22) Filed: Nov. 30, 2007

(65) Prior Publication Data

US 2009/0142481 A1 Jun. 4, 2009

(51) Int. Cl.
*H01B 1/02* (2006.01)
*H01B 1/22* (2006.01)
*B05D 5/12* (2006.01)
*C09D 11/02* (2006.01)

(52) U.S. Cl. ............ 252/512; 252/519.4; 427/123; 106/31.13; 106/31.92

(58) Field of Classification Search .......... 252/512, 252/519.4; 427/123; 106/31.13, 31.92
See application file for complete search history.

(56) References Cited

U.S. PATENT DOCUMENTS

| | | | |
|---|---|---|---|
| 7,749,300 B2 * | 7/2010 | Chretien et al. ............ 75/371 |
| 7,789,935 B2 * | 9/2010 | Chretien et al. ............ 75/371 |
| 2003/0180451 A1 | 9/2003 | Kodas et al. |
| 2004/0089101 A1 | 5/2004 | Winter et al. |
| 2004/0175548 A1 | 9/2004 | Lawrence et al. |
| 2005/0078158 A1 | 4/2005 | Magdassi et al. |
| 2006/0053972 A1 | 3/2006 | Liu et al. |
| 2008/0161213 A1 * | 7/2008 | Jao et al. ............ 508/165 |
| 2008/0164141 A1 * | 7/2008 | El-Shall et al. .......... 204/157.21 |
| 2009/0274834 A1 * | 11/2009 | Chopra et al. ............ 427/125 |
| 2009/0301344 A1 * | 12/2009 | Chretien et al. .......... 106/31.13 |
| 2010/0009071 A1 * | 1/2010 | Chopra et al. ............ 427/123 |
| 2010/0233361 A1 * | 9/2010 | Hu et al. .................. 427/125 |
| 2010/0239750 A1 * | 9/2010 | Breton et al. ............ 427/99.4 |
| 2010/0273665 A1 * | 10/2010 | Haick et al. .............. 506/8 |

FOREIGN PATENT DOCUMENTS

WO WO 2006080318 A1 * 8/2006

OTHER PUBLICATIONS

CAS Reg. No. 6253-37-8, Nov. 16, 1984.*
Tzhayik, O., et al., "Xanthate Capping of Silver, Copper, and Gold Colloids", Langmuir, 18 (2002), 3364-3369.*
Dhas, N. Arul et al. "Synthesis, Characterization, and Properties of Metallic Copper Nanonparticles", Chem Mater, vol. 10, pp. 1446-1452, 1998.
Volkman, Steven K. et al. "Ink-jetted Silver/Copper conductors for printed RFID applications", Mat. Res. Soc. Symp. Proc., vol. 814, pp. 17.8.1-17.8.6, 2004.
Jana, Nikhil R. et al., "Seed-mediated growth method to prepare cubic copper nanoparticles", Current Science, vol. 79, No. 9, pp. 1367-1370, Nov. 10, 2000.
Wu, Chunwei et al., "Simple One-Step Synthesis of Uniform Disperse Copper Nanoparticles", Mater. Res. Soc. Symp. Proc, vol. 879 E, pp. Z6.3.1-Z6.3.6, 2005.
Chen, Ming et al. "Phase transition of silver nanoparticles from aqueous solution to chloroform with the help of inclusion complexes of p-sulfonated calix[4]arene and alkanethiol molecules and its application in the size sorting of nanoparticles", Nanotechnology, vol. 18, 175706, pp. 1-7, 2007.

* cited by examiner

*Primary Examiner* — Douglas McGinty
(74) *Attorney, Agent, or Firm* — Oliff & Berridge, PLC

(57) ABSTRACT

Low-cost copper nanoparticle inks that can be annealed onto paper substrate for RFID antenna applications, using substituted dithiocarbonates as stabilizers during copper nanoparticle ink production.

14 Claims, No Drawings

AIR STABLE COPPER NANOPARTICLE INK AND APPLICATIONS THEREFOR

TECHNICAL FIELD OF THIS DISCLOSURE

The present disclosure relates to low-cost copper nanoparticle inks, and air stable copper nanoparticle inks, that can be, for example, annealed onto paper substrates for RFID antenna applications. The air stable copper nanoparticle inks are formed using a substituted dithiocarbonate, such as an alkyl xanthate or an ether alcohol-based xanthate, as a stabilizer during copper nanoparticle ink production.

BACKGROUND

Recently, radio frequency identification (RFID) technology has gained tremendous popularity as a device for storing and transmitting information. RFID technology utilizes a tag transponder, which is placed on an object, and a reader, also referred to herein as an interrogator, to read and identify the tag. RFID technologies are broadly categorized as using either "active" tags or "passive" tags. Active tags have a local power source (such as a battery) so that the active tag sends a signal to be read by the interrogator. Active tags have a longer signal range. "Passive" tags, in contrast, have no internal power source. Instead, passive tags derive power from the reader, and the passive tag re-transmits or transponds information upon receiving the signal from the reader. Passive tags have a much shorter signal range (typically less than 20 feet).

Both categories of tags have an electronic circuit that is typically in the form of an integrated circuit or silicon chip. The circuit stores and communicates identification data to the reader. In addition to the chip, the tag includes some form of antenna that is electrically connected to the chip. Active tags incorporate an antenna that communicates with the reader from the tag's own power source. For passive tags, the antenna acts as a transducer to convert radio frequency (RF) energy originating from the reader to electrical power. The chip then becomes energized and performs the communication function with the reader.

On the other hand, a chipless RFID tag has neither an integrated circuit nor discrete electronic components, such as the transistor or coil. This feature allows chipless RFID tags to be printed directly onto a substrate at lower costs than traditional RFID tags.

As a practical matter, RFID technology uses radio frequencies that have much better penetration characteristics to material than do optical signals, and will work under more hostile environmental conditions than bar code labels. Therefore, the RFID tags may be read through paint, water, dirt, dust, human bodies, concrete, or through the tagged item itself. RFID tags may be used in managing inventory, automatic identification of cars on toll roads, security systems, electronic access cards, keyless entry and the like.

Antennas are an element of RFID tags that are typically prepared via stamping/etching techniques, wherein a foil master is carved away to create the final structure. The RFID antenna may also be printed directly on the substrate using a conductive metal ink. The ink is printed on a substrate, followed by high temperature sintering in order to anneal the particles and to create a conductive line on the substrate. Alternatively, metal fibers may be incorporated directly into the substrate. For example, one chipless RFID technology from Inkode Corp® uses embedded aluminum fibers that are embedded into paper. The aluminum fibers must be cut to the appropriate wavelength (¼ wavelength) and be incorporated into the paper fibers as a furnish additive during the papermaking process. Therefore, the Inkode® method is costly and tedious.

Although particulate metal materials may be used, the superior characteristics of nanoparticle metal materials in ink applications yields a better product. Metallic nanoparticles are particles having a diameter in the submicron size range. Nanoparticle metals have unique properties, which differ from those of bulk and atomic species. Metallic nanoparticles are characterized by enhanced reactivity of the surface atoms, high electric conductivity, and unique optical properties. For example, nanoparticles have a lower melting point than bulk metal, and a lower sintering temperature than that of bulk metal. The unique properties of metal nanoparticles result from their distinct electronic structure and from their extremely large surface area and high percentage of surface atoms.

Metallic nanoparticles are either crystalline or amorphous materials. They can be composed of pure metal, such as silver, gold, copper, etc., or a mixture of metals, such as alloys, or core of one or more metals such as copper covered by a shell of one or more other metals such as gold or silver. The nozzles in an inkjet printing head are approximately 1 µm in diameter. In order to jet a stream of particles through a nozzle, the particles' size should be less than approximately one-tenth of the nozzle diameter. This means that in order to inkjet a particle, its diameter must be less than about 100 nm.

Nickel has been used for conductive inks for a very limited extent because of its relatively low conductivity (approximately 4 times less than that of copper or silver). Gold and silver can provide good conductivity, but are relatively expensive. Moreover, gold and silver require high temperatures for annealing, which can pose a challenge for printing on paper and plastic substrates. Copper provides good conductivity at a low price (about one percent of that of silver). Unfortunately, copper is easily oxidized and the oxide is non-conductive. Conventional copper-based nanoparticle inks are unstable and require an inert/reducing atmosphere during preparation and annealing in order to prevent spontaneous oxidation to non-conductive CuO or $CU_2O$. Copper polymer thick film (PFT) inks have been available for many years and can be used for special purposes, for example, where solderability is required. Another interesting strategy is to combine the advantages of both silver and copper. Silver plated copper particles are commercially available, and are used in some commercially available inks. Silver plating provides the advantages of silver for inter-particle contacts, while using the cheaper conductive metal (copper) for the bulk of the particle material. Thus, the only reliable means of preparing copper antennas is via electroplating on an existing metal surface.

REFERENCES

U.S. Pat. Publication No. 2004/0175548 A1 (Lawrence et al) describes a conductive ink that is suitable for gravure or flexographic printing and includes a carboxylic acid or anhydride-functional aromatic vinyl polymer and an electrically conductive material that may be either a particulate material or a flake material, particularly a conductive flake material having an aspect ratio of at least about 5:1.

Dhas et al., *Chem Mater*, 10, 1446-52, (1998) discusses a method for metallic copper nanoparticle synthesis by using an argon/hydrogen (95:5) atmosphere in order to avoid formation of impurities, such as copper oxide.

Volkman et al, *Mat. Res. Soc. Proc.* Vol. 814, 17.8.1-17.8.6 (2004) describes processes for forming silver and copper nanoparticles, and discusses the optimization of the printing/annealing processes to demonstrate plastic-compatible low-resistance conductors.

Jana et al., *Current Science* vol. 79, No. 9 (Nov. 10, 2000) describes preparation of cubic copper particles, in which cube-shaped copper nanoparticles in the size range of about 75 to 250 nm are formed from smaller spherical copper particles.

Wu et al, *Mater. Res. Soc. Symp. Proc.* Vol. 879 E, Z6.3.1-Z6.3.6 (2005) describes a solution-phase chemical reduction method with no inert gas protection, for preparing stable copper nanoparticle colloid with average particle size of 3.4 nm and narrow size distribution using ascorbic acid as both a reducing agent and an antioxidant to reduce copper sale precursor and effectively prevent the general oxidation process occurring to the newborn nanoparticles.

Chen et al., *Nanotechnology*, 18, 175706 (2007) describes silver nanoparticle synthesis in aqueous solution and capped with an inclusion complex of octadecanethiol (ODT) and p-sulfonated calix[4]arene (pSC4).

U.S. Pat. Publication No. 2006/0053972 A1 (Liu et al.) describes a process for producing copper nanoparticles in the form of a solid powder, by first reacting an aqueous solution containing a reductant with an aqueous solution of a copper salt, followed by adding an apolar organic solution containing the extracting agent, then finally post-treating the reaction product to obtain copper nanoparticles.

U.S. Pat. Publication No. 2005/0078158 A1 by Magdassi et al. describes compositions for use in inkjet printing onto a substrate via a water based dispersion including metallic nanoparticles and appropriate stabilizers. Magdassi also describes methods for producing such compositions and methods for their use in ink jet printing onto suitable substrates.

U.S. Pat. Publication No. 2004/0089101 A1 by Winter et al. describes methods of making monodisperse nanocrystals via reducing a copper salt with a reducing agent, providing a passivating agent including a nitrogen and/or an oxygen donating moiety, and isolating the copper nanocrystals. Winter also describes methods for making a copper film via the steps of applying a solvent including copper nanocrystals onto a substrate and heating the substrate to form a film of continuous bulk copper from the nanocrystals. Finally, Winter also describes methods for filling a feature on a substrate with copper via the steps of applying a solvent including copper nanocrystals onto the featured substrate and heating the substrate to fill the feature by forming continuous bulk copper in the feature.

U.S. Pat. Application No. 2003/0180451 by Kodas et al. discloses a precursor composition for the deposition and formation of an electrical feature such as a conductive feature. The precursor composition advantageously has a low viscosity enabling deposition using direct-write tools. The precursor composition also has a low conversion temperature. A particularly preferred precursor composition includes copper metal for the formation of highly conductive copper features.

The above-described methods for creating copper nanoparticles suffer from several drawbacks. Most of the methods require a reducing/inert atmosphere to avoid oxidation of the copper particles. The methods described that do not require a reducing/inert atmosphere suffer from the limitations that the particles formed are too large to be annealed at a lower temperature (<200° C.). Alternatively, the methods produce in low yields. The requirements for preparing copper nanoparticles for preparation of large volumes of chipless RFID tags are: stability under atmospheric conditions, small particle size, and high throughput yield. Thus, there exists a need for a cheaper method of producing chipless RFID tags. There also exists a need for conductive inks that can be used for such applications, and that can be more easily and cost-effectively produced and used.

SUMMARY

The present disclosure provides for a copper nanoparticle ink composition, including: copper nanoparticles; a substituted dithiocarbonate stabilizer; and a carrier solvent; wherein the stabilizer stabilizes the copper nanoparticles.

The present disclosure also provides a process for forming a copper nanoparticle ink composition, including: providing a substituted dithiocarbonate stabilizer; and stabilizing a copper nanoparticle dispersion with the substituted dithiocarbonate stabilizer in a solvent medium.

The advantages of the present disclosure are numerous. The copper nanoparticle inks prepared according to the present disclosure exhibit good dispersity and stability at room temperature, thus enabling annealing of the ink to a substrate in an ambient environment, without the need for an inert environment, such as a $N_2/H_2$ environment. Moreover, the method of preparing copper nanoparticle ink according to the present disclosure results in a higher product yield when compared to conventional approaches to preparing copper nanoparticles. Consequently, there are many applications of the air stable copper nanoparticle ink according to the present disclosure, particularly applications in RFID antenna formation. As compared to RFID antennas formed using silver nanoparticle ink, the present disclosure provides a cheaper method for forming RFID antennas without sacrificing conductivity.

EMBODIMENTS

This disclosure is not limited to particular embodiments described herein, and some components and processes may be varied by one of ordinary skill in the art, based on this disclosure. The terminology used herein is for the purpose of describing particular embodiments only, and is not intended to be limiting.

In this specification and the claims that follow, singular forms such as "a," "an," and "the" include plural forms unless the content clearly dictates otherwise.

In general, the disclosure provides an air stable copper nanoparticle ink and a method of forming thereof, in which the copper nanoparticle ink can be used, for example, in electrical applications, such as to form conductive lines for use as resonant antennae in chipless RFID applications. The air stable copper nanoparticle ink is generally formed by stabilizing copper nanoparticles with a substituted dithiocarbonate stabilizer in a solvent medium during copper nanoparticle preparation. The air stable copper nanoparticle ink can then be printed on a desired substrate, such as paper or plastic, and then annealed by heating it in an ambient environment to form conductive lines. The conductive lines can be used, for example, in RFID applications.

Generally, the air stable copper nanoparticle ink in embodiments comprises copper nanoparticles stabilized by a suitable substituted dithiocarbonate in a carrier solvent.

The copper nanoparticles are desirably in the nanometer size range. For example, in embodiments, the copper nanoparticles have an average particle size of from about 1 to about 500 nm, such as from about 1 to about 200 nm, or about 1 to about 50 nm, or about 2 to about 20 nm. Herein, "average" particle size is typically represented as $d_{50}$, or defined as the median particle size value at the 50th percentile of the particle size distribution, wherein 50% of the particles in the distribution are greater than the $d_{50}$ particle size value and the other 50% of the particles in the distribution are less than the $d_{50}$ value. Average particle size can be measured by methods that use light scattering technology to infer particle size, such as Dynamic Light Scattering. The particle diameter refers to the length of the pigment particle as derived from images of the particles generated by Transmission Electron Microscopy (TEM).

The stabilizer used in the present disclosure to stabilize the copper nanoparticles is a substituted dithiocarbonate. In embodiments, the substituted dithiocarbonate is a compound of formula (1):

$$R-O-C(=S)S^-M^+ \qquad \text{Formula (1)}$$

where M represents a suitable counter cation, such as H, Li, Na, K, Rb, Cs, or the like, and R represents an organic group. Exemplary organic groups R include, for example, cyclic and acyclic groups, straight or branched alkyl groups having from 1 to about 20 carbon atoms, including methyl, ethyl, propyl, isopropyl, butyl, tert-butyl, and the like; aryl groups having from 1 to about 20 carbon atoms; straight or branched aralkyl or alkaryl groups having from 1 to about 20 carbon atoms; straight or branched alkoxy groups having from 1 to about 20 carbon atoms and 1 to about 5 oxygen atoms, such as 2-butoxymethyl, 2-butoxyethyl, 2-methoxy-1-butyl, and the like, where such straight or branched alkoxy groups can be derived, for example, from ether alcohols; straight or branched aryloxy groups having from 1 to about 20 carbon atoms and 1 to about 5 oxygen atoms; and the like. Moreover, the R group can include diols, such as glycols, including ethylene glycol, propylene glycol, diethylene glycol, and polyols, such as poly(ethylene) glycol or poly(propylene) glycol. The R group can also be unsubstituted or substituted, for example, by one or more halogens.

In other embodiments, the substituted dithiocarbonate is a compound of formula (2):

$$R_1-X-R_2-C(=S)S^-M^+ \qquad \text{Formula (2)}$$

where M is a suitable counter cation, such as H, Li, Na, K, Rb, Cs, or the like. $R_1$ and $R_2$ are organic groups, which can be substituted or unsubstituted, such as straight or branched alkyl groups having from 1 to about 20 carbon atoms, including methyl, ethyl, propyl, isopropyl, butyl, tert-butyl, and the like; aryl groups having from 1 to about 20 carbon atoms, straight or branched aralkyl or alkaryl groups having from 1 to about 20 carbon atoms; and the like. In addition, either or both of the $R_1$ and $R_2$ groups can include one or more heteroatoms, such as O, S, N (in the form of NH), and the like. Likewise, X is a heteroatom, such as O, S, N (in the form of NH), or the like.

Generally, suitable solvent or carrier media can be polar or non-polar. Solvents that are useful according to the present disclosure include, without limitation, amines, amides, alcohols, terpene alcohols, esters, water, ketones, ethers, aromatics, substituted aromatics, terpenes, essential oils, aldehydes, alkenes, unsaturated hydrocarbons, saturated hydrocarbons, mineral acids organic acids and bases. Other suitable solvents include, without limitation, N,N,-dimethylacetamide (DMAc), diethyleneglycol butylether (DEGBE), ethanolamine and N-methyl pyrrolidone, dichloromethane, MEK, toluene, ketones, benzene, chlorotoluene, nitrobenzene, dichlorobenzene, NMP (N-methylpyrrolidinone), DMA (dimethylacetamide), ethylene glycol, diethylene glycol, DEGBE (diethylene glycol butyl ether), and propylene glycol.

In some cases, the solvent can be a high melting point solvent, such as one having a melting point of at least about 30° C. and not greater than about 100° C. In this embodiment, a heated ink-jet head can be used to deposit the copper nanoparticle ink composition while in a flowable state, whereby the solvent solidifies upon contacting the substrate. Subsequent processing can then remove the solvent by other means and then convert the material to the final product, thereby retaining resolution. Suitable solvents can include waxes, high molecular weight fatty acids, alcohols, acetone, N-methyl-2-pyrrolidone, toluene, tetrahydrofuran and the like. Alternatively, the copper nanoparticle ink composition may be a liquid at room temperature, wherein the substrate is kept at a lower temperature below the freezing point of the composition.

In addition, the copper nanoparticle ink composition according to this disclosure can generally also include one or more additional additives. Additives can include, for example, co-solvents, waxes, antioxidants, tackifiers, slip aids, curable components such as curable monomers and/or polymers, gellants, initiators, sensitizers, humectants, biocides, preservatives, and the like.

The molar ratio of the copper to the stabilizer present in the solvent or carrier media is generally from about 1:1 to about 1:5, such as about 1:2 to about 1:4 or about 1:3. Additionally, the molar ratio of the copper to the stabilizer present in the solvent or carrier media is generally from 1:1 to about 5:1. That is, more copper is present as compared to stabilizer. Additionally, more than one xanthate group may be present in a single stabilizer molecule. In such instances, the molar ratio of the copper to the stabilizer present in the solvent or carrier media is adjusted accordingly. Generally, the molar ratio of the copper to the additives vary, depending on the additive. Likewise, the concentration of the combined nanoparticles and stabilizer in the solvent can be from about 1 to about 70 percent by weight of the total composition, such as from about 2 to about 50 or from about 5 to about 25 percent by weight. Any other optional additives can be included in the composition in any known or effective amounts for their intended purposes. Of course, values outside any of these ranges can be used, as desired.

One benefit of the copper nanoparticle ink composition according to the present disclosure is that it is stable under ambient conditions and does not require the presence of an inert gas atmosphere in order to prevent spontaneous oxidation to nonconductive CuO or $Cu_2O$. Therefore, the ink may generally be exposed to the air for a period of about 1 day to about 6 days without diminished stability. Additionally, copper nanoparticles should be prevented from settling in the ink over a prolonged period of time, and they should remain suspended in the liquid vehicle. This can be achieved by any known means, such as, for example, a stir plate.

The process for preparing the ink composition is now described in more detail. The process generally comprises preparing or providing a suitable stabilizer compound, and then using that stabilizer compound to stabilize copper nanoparticles during nanoparticle formation. In the first step, if the stabilizer is not a commercially available compound, then it can be prepared from appropriate starting materials.

Alkyl Xanthate Preparation

The stabilizer in one embodiment can be an alkyl xanthate, such as those of formula (1) above. Such alkyl xanthates can be prepared, for example, by reacting a starting material with carbon disulfide in an aqueous/organic solution and in the presence of a strong base such as KOH. The starting material generally can be any substituted or unsubstituted alcohol of an n-carbon hydrocarbon, where n represents the number of carbons in the hydrocarbon. To the hydrocarbon alcohol in aqueous solution, a base such as KOH is added, generally with stirring and/or heating to dissolve the solid base, allowing it to react and generate the oxyanion of the hydrocarbon alcohol. If the hydrocarbon alcohol is a solid, it can be predissolved in an organic solution, prior to addition of KOH base. Next, an organic solvent media can be added, followed by adding carbon disulfide, to yield an alkyl xanthate product as a solid precipitate. The solid product is isolated via filtration to yield an alkyl xanthate powder product. Depending on the alcohol used, some xanthate products can be liquids or viscous gels, and are isolated by liquid/liquid extraction.

Other bases besides KOH can be used, such as NaOH, but KOH is preferred. Organic bases may also be used, such as DBU, pyridine, LDA, or alkoxide bases such as potassium t-butoxide, sodium isopropoxide, sodium ethoxide, etc, Ether Alcohol Based Xanthate Preparation The stabilizer in another embodiment can be an ether alcohol based xanthate, such as those of formula (2) above. Such compounds can be prepared similar to the preparation of the alkyl xanthates, for example, by reacting a starting material with carbon disulfide in an aqueous/organic solution and in the presence of a base such as KOH. The starting material generally can be any substituted or unsubstituted ether alcohol. To the ether alcohol in aqueous solution, the base, such as KOH is added, generally with stirring and/or heating to dissolve the solid base, allowing it to react and generate the oxyanion of the hydrocarbon alcohol. If the hydrocarbon alcohol is a solid, it can be predissolved in an organic solution, prior to addition of KOH base. Next, an organic solvent media can be added, followed by adding carbon disulfide, to yield an alkyl xanthate product as a solid precipitate. The solid product is isolated via filtration to yield an alkyl xanthate powder product. Depending on the alcohol used, some xanthate products can be liquids or viscous gels, and are isolated by liquid/liquid extraction.

Other bases besides KOH can be used, such as NaOH, but KOH is preferred. Organic bases may also be used, such as DBU, pyridine, LDA, or alkoxide bases such as potassium t-butoxide, sodium isopropoxide, sodium ethoxide, etc.

Stabilization with the Stabilizer

In the second step of the process according to the disclosure, the substituted dithiocarbonate stabilizes the copper nanoparticle during nanoparticle formation, using basic principles of traditional mineral floatation and ion extraction. This is generally accomplished by reacting a starting metal (copper) salt with a reducing agent, in the presence of an extracting agent and the substituted dithiocarbonate stabilizer, typically in an aqueous solution. For example, to an aqueous solution containing a reducing agent, the substituted dithiocarbonate stabilizer in an aqueous solution is added, followed by the addition of a copper salt in aqueous solution.

Suitable reducing agents that may be used include, without limitation, sodium borohydride, sodium hypophosphite, hydrazine hydrate, phenylhydrazine, ascorbic acid, glucose, lithium aluminum hydride, lithium triethyl borohydride (superhydride), 1,2-hexadecanediol, mixtures thereof, and the like. Such reducing agents can be used, for example, in an amount of from about 1 mole to about 100 moles, such as from about 1 mole to about 10 moles per mole of copper salt.

Suitable copper salts can be categorized as copper I and copper II compounds. They can be categorized as inorganic, metal organic, and organometallic. They can also be categorized as copper hydrides, copper amides, copper alkenes, copper allyls, copper carbonyls, copper metallocenes, copper cyclopentadienyls, copper arenes, copper carbonates, copper hydroxides, copper carboxylates, copper oxides, organo copper, copper beta-diketonates, copper alkoxides, copper beta-ketoiminates, copper halides, and copper alkyls.

In embodiments, the copper salt can be, without limitation, copper sulfate, copper chloride, copper acetate, copper (II) nitrate and amine complexes thereof, copper carboxylates, copper beta-diketonates such as copper hexafluoracetylacetonate, copper (acetylacetonate), copper bromide, copper iodide, copper fluoride, copper formate, copper formate hydrate, copper hydroxide, copper, copper sulfide, copper trifluoracetate hydrate, copper trifluoromethanesulfonate, or copper-neodecanoate. Metal soaps, such as copper stearate, copper oleate, copper laurate, copper napthenate, and copper 2-ethylhexanoate, or a mixture thereof, are also suitable. Generally, the copper salt can be provided in solution in any concentration that will allow the copper nanoparticle formation to proceed, such as a concentration of from about 0.02 to about 50 percent by weight, such as about 0.1 to about 20 percent by weight.

Next, an extracting agent is added to the mixture. Suitable extracting agents include, without limitation, sodium dihydrogen phosphate, bis(ethylhexyl)hydrogen phosphate, bis (ethylhexyl)sulfosuccinate (AOT, or Aerosil OT), cetyltrimethylammonium bromide (CTAB). Such extracting agents can be used, for example, in an amount of from about 1 mole to about 50 moles, such as from about 1 mole to about 5 moles, per mole of copper salt.

Finally, an apolar organic solution that is immiscible with the aqueous phase is added and mixed. The presence of the apolar solvent medium causes the copper nanoparticles to be transferred to the organic phase. Suitable solvents include, without limitation, dichloromethane, toluene, benzene, nitrobenzene, xylene, dichlorobenzene, mesitylene, hexane, and isopar.

Once the stabilized copper nanoparticles are formed, they can be suitable collected, washed, or otherwise processed for desired applications. For example, the obtained stabilized copper nanoparticles can be separated from the production medium, and dispersed in the above-described solvents for preparing ink compositions or the like. If less polar solvents are required for the ink, it is possible to remove the solvent from the extracted copper nanoparticles by rotary evaporation, and redispersion of the particles in another solvent (such as DMA (dimethyacetamide), or ethylene glycol, or others. An appropriate solvent is chosen based on the polarity of the copper nanoparticles and the properties of in the ink (surface tension, viscosity, etc.) required for the Inkjet step.

Printing and Annealing of Copper Nanoparticle Ink

The copper nanoparticle ink may generally be printed on a suitable substrate such as, without limitation, paper, glass art paper, bond paper, paperboard, Kraft paper, cardboard, semisynthetic paper or plastic sheets, such as polyester or polyethylene sheets, and the like. These various substrates can be provided in their natural state, such as uncoated paper, or they can be provided in modified forms, such as coated or treated papers or cardboard, printed papers or cardboard, and the like.

For printing the copper nanoparticle ink on a substrate, any suitable printing method may be used. For example, suitable methods include, without limitation, roll-to-roll high volume analog printing methods, such as gravure, rotogravure, flexography, lithography, etching, screenprinting, and the like. Additionally, digital printing methods, such as for example, inkjet printing may be used.

Annealing the copper ink to the substrate can be done by suitable means in the art. In an exemplary embodiment, the substrate is heated at a temperature in the range of about 50"C to about 1000° C. In another exemplary embodiment, the substrate is heated at a temperature in the range of about 100°

C. to 250° C. The substrate is heated at a time period in the range of about 10 to about 30 minutes. The printing and annealing steps are generally performed in an ambient environment. Generally, an ambient environment refers to a normal atmospheric air environment, not requiring the presence of an inert gas environment. In addition, the printing and annealing steps can be performed simultaneously or consecutively.

As a practical matter, the air stable copper ink according to this disclosure may generally be used to print conductive lines on substrate for use in various applications, including forming antennae for use in RFID applications.

An example is set forth herein below and is illustrative of different compositions and conditions that can be utilized in practicing the disclosure. All proportions are by weight unless otherwise indicated. It will be apparent, however, that the disclosure can be practiced with many types of compositions and can have many different uses in accordance with the disclosure above and as pointed out hereinafter.

EXAMPLES

Example 1

Preparation of Alkyl Xanthate-Stabilized Copper Nanoparticle Ink

Step 1: Octyl Xanthate Preparation

In a 200 mL round bottom flask, 6.4 mL (40 mmol) of 1-octanol was added and heated with stirring to 150° C., followed by the addition of 2.24 g (40 mmol) of KOH. The mixture became yellow-brown in color. Once all of the KOH was dissolved, the mixture was cooled to 100° C., and 25 mL of toluene was added, then cooled to 0° C. with an ice bath. Next, 3.5 mL of carbon disulfide (58 mmol) was added dropwise, yielding a creamy orange precipitate. The mixture was stirred for 1 h at room temperature. After 1 h, 100 mL of hexanes was added, and the mixture was stirred for 2 h, then filtered via vacuum filtration to furnish 4.5-5 g of yellow powder product (55-60% yield).

Step 2: Octyl Xanthate Stabilized Copper Nanoparticle Formation

In three 250 mL beakers, copper (II) nitrate (188 mg in 100 mL of water), octylxanthate (205 mg in 100 mL of water), and sodium borohydride (150 mg in 100 mL of water) solutions were prepared. The sodium borohydride solution was kept on ice for 15 min. Next, the octylxanthate solution was added to the sodium borohydride solution, followed by the slow addition of the copper (II) nitrate solution, yielding a transparent orange colored solution. After stirring for 5 min, 12 g of sodium dihydrogen phosphate was added to the mixture, forming a brown suspension with some foaming. Next, the brown suspension was added to 250 mL of dichloromethane and mixed in a separately funnel. The copper nanoparticles were transferred to the organic phase, and the aqueous phase became clear.

Step 3: Annealing of Copper into onto the Paper

A spiral ink trace was drawn on a piece of paper (heated to 170° C. on a hotplate) using a micropipette dipped in the copper nanoparticle ink. The trace was overprinted several times to yield a thick film. The dichloromethane evaporated almost instantly, and the copper film darkened shortly thereafter, indicating annealing of the nanoparticles. The conductivity of the line was confirmed using a multimeter. The reading of the multimeter was 0.373 volts.

Example 2

Preparation of Ether Alcohol Xanthate-Stabilized Copper Nanoparticle Ink

Step 1: 2-Butoxyethyl Xanthate Preparation

In a 100 mL round bottom flask, 5.25 mL (40 mmol) of 2-butoxyethanol was added and heated with stirring to 150° C., followed by the addition of 2.25 g (40 mmol) of KOH. The mixture became yellow-brown in color. Once all of the KOH was dissolved, the mixture was cooled to 100° C., and 25 mL of toluene was added, then cooled to 0° C. with an ice bath. Next, 3.5 mL of carbon disulfide (58 mmol) was added dropwise, yielding a creamy yellow precipitate. The mixture was stirred for 1 h at room temperature. After 1 h, 100 mL of hexanes was added, and the mixture was stirred for 1 h, then filtered via vacuum filtration to yield 4.5-5 g of yellow powder product (55-60% yield).

Step 2: 2-Butoxyethyl Xanthate Stabilized Copper Nanoparticle Formation.

In a 250 mL Erlenmeyer flask, 100 mg of copper (II) nitrate was dissolved by stirring in 50 mL of water. In a second 125 mL Erlenmeyer flask, 100 mg of 2-butoxyethyl xanthate and 75 mg of sodium borohydride were dissolved with stirring in 50 mL of water. The second solution was stored on ice for 10 minutes, and then added to the copper solution, forming a brown suspension. Next, 3 g of sodium phosphate was slowly added to the mixture, resulting in vigorous foaming. The solution was transferred to a 500 mL separatory funnel, and extracted with 100 mL of toluene. The toluene solution became brown and the aqueous layer became clear, indicating the partitioning of the copper nanoparticles into the toluene solution. The aqueous phase was discarded, and the copper nanoparticle synthesis was repeated in order to harvest more copper nanoparticles into the toluene solution. This semi-continuous process yielded a concentrated solution of copper nanoparticles in toluene.

Step 3: Annealing of Copper Ink onto Paper

A drop of the copper nanoparticle ink was dispensed onto a paper substrate (heated to 170° C. on a hotplate), by using a micropipette dipped in the ink. The toluene evaporated almost instantly, and the copper film darkened after 10 minutes of heating, indicating annealing of the nanoparticles. The conductivity of the line was confirmed using a multimeter. The multimeter reading was 0.710 volts.

It will be appreciated that various of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art, and are also intended to be encompassed by the following claims.

What is claimed is:

1. A copper nanoparticle ink composition, comprising:
copper nanoparticles;
a substituted dithiocarbonate stabilizer comprising an ether alcohol based xanthate compound of formula:

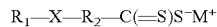

where:
M is counter cation;
each of $R_1$ and $R_2$ is independently a substituted or unsubstituted organic group having from 1 to about 20 carbon atoms, optionally having one or more heteroatoms; and
X is a heteroatom; and a carrier solvent;
wherein the stabilizer stabilizes the copper nanoparticles.

2. The copper nanoparticle ink composition according to claim 1, wherein each of $R_1$ and $R_2$ independently is selected from the group consisting of:
a substituted or unsubstituted straight or branched alkyl groups;
a substituted or unsubstituted aryl group; and
a substituted or unsubstituted straight or branched aralkyl or alkaryl group.

3. The copper nanoparticle ink composition according to claim 1, wherein M is selected from the group consisting of H, Li, Na, K, Rb, and Cs.

4. The copper nanoparticle ink composition according to claim 1, wherein the carrier solvent is selected from the group consisting of MEK, toluene, dichloromethane, toluene, benzene, nitrobenzene, xylene, dichlorobenzene, mesitylene, hexane, and isopar.

5. The copper nanoparticle ink composition according to claim 1, wherein the ink composition is configured to be printed and annealed onto a substrate in an ambient environment.

6. The copper nanoparticle ink composition according to claim 1, wherein the copper nanoparticles have an average particle size from about 1 to about 500 nm.

7. The copper nanoparticle ink composition according to claim 1, wherein the ink composition is configured for forming conductive lines for RFID antenna applications.

8. A process for forming a copper nanoparticle ink composition, comprising:
providing a substituted dithiocarbonate stabilizer comprising an ether alcohol based xanthate compound of formula:

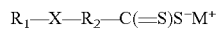

where:
M is counter cation;
each of $R_1$ and $R_2$ is independently a substituted or unsubstituted organic group having from 1 to about 20 carbon atoms, optionally having one or more heteroatoms; and
X is a heteroatom; and
stabilizing a copper nanoparticle dispersion with the substituted dithiocarbonate stablizer in a solvent medium.

9. The process according to claim 8, wherein each of $R_1$ and $R_2$ independently is selected from the group consisting of:
a substituted or unsubstituted straight or branched alkyl group;
a substituted or unsubstituted aryl group; and
a substituted or unsubstituted straight or branched aralkyl or alkaryl group.

10. The process according to claim 8, wherein the carrier solvent is selected from the group consisting of MEK, toluene, dichloromethane, toluene, benzene, nitrobenzene, xylene, dichlorobenzene, mesitylene, hexane, and isopar.

11. A process for forming conductive lines on a substrate, comprising:
printing the copper nanoparticle ink composition of claim 1 onto a substrate in an ambient environment; and
annealing the ink composition onto the substrate in an ambient environment.

12. The process according to claim 11, wherein the conductive lines are for RFID antenna applications.

13. The process according to claim 11, wherein the copper nanoparticles do not oxidize to non-conductive copper species prior to the annealing.

14. The process according to claim 8, wherein M is selected from the group consisting of H, Li, Na, K, Rb, and Cs.

* * * * *